United States Patent
Mack

[19]

[11] Patent Number: 6,121,831
[45] Date of Patent: Sep. 19, 2000

[54] APPARATUS AND METHOD FOR REMOVING OFFSET IN A GAIN CIRCUIT

[75] Inventor: Michael Peter Mack, San Francisco, Calif.

[73] Assignee: Level One Communications, Inc., Sacramento, Calif.

[21] Appl. No.: 09/310,607

[22] Filed: May 12, 1999

[51] Int. Cl.[7] .............................. H03F 1/02; H03F 1/14; H03F 3/45; H03L 5/00
[52] U.S. Cl. .............................. 330/9; 330/51; 330/254; 327/307
[58] Field of Search .............................. 330/9, 51, 254; 327/307

[56] References Cited

U.S. PATENT DOCUMENTS

| | | | |
|---|---|---|---|
| 3,764,922 | 10/1973 | Gilbert et al. | 307/229 |
| 4,653,117 | 3/1987 | Heck . | |
| 4,801,888 | 1/1989 | Haque | 330/9 |
| 4,873,702 | 10/1989 | Chiu . | |
| 4,944,025 | 7/1990 | Gehring et al. . | |
| 5,086,437 | 2/1992 | Tomita . | |
| 5,107,225 | 4/1992 | Wheatley, III et al. . | |
| 5,264,804 | 11/1993 | Fox | 330/9 |
| 5,269,313 | 12/1993 | DePinto . | |
| 5,394,109 | 2/1995 | Simard . | |
| 5,436,590 | 7/1995 | Simard et al. . | |
| 5,452,473 | 9/1995 | Weiland et al. . | |
| 5,465,272 | 11/1995 | Smith . | |
| 5,508,656 | 4/1996 | Jaffard et al. | 330/9 |
| 5,617,060 | 4/1997 | Wilson et al. . | |
| 5,748,681 | 5/1998 | Comino et al. . | |
| 5,757,219 | 5/1998 | Weedon et al. | 327/307 |
| 5,793,230 | 8/1998 | Chu et al. | 327/307 |
| 5,798,664 | 8/1998 | Nagahori et al. | 327/307 |

OTHER PUBLICATIONS

Cho, T. et al., "A Power–Optimized CMOS Baseband Channel Filter and ADC for Cordless Applications", pp. 1–4 (Aug. 10, 1998).

*Primary Examiner*—Robert Pascal
*Assistant Examiner*—Patricia T. Nguyen
*Attorney, Agent, or Firm*—Merchant & Gould P.C.

[57] ABSTRACT

An offset-removing gain circuit where the detected offset is independent of the gain of the circuit. The gain circuit includes a differential amplifier transfer circuit with an input and a output, an integrator connected to the output of the differential amplifier transfer circuit through a first impedance, and a second impedance connecting an output of the integrator to the input of the differential amplifier. The impedances may include resistors, capacitors or combinations thereof. The circuit may further include a switched capacitor circuit, where a plurality of capacitors are connected between input and output terminals using switches, whereby the capacitance of the switched capacitor circuit is altered by the switches to remove offset at the integrator output without changing the frequency response thereof.

19 Claims, 7 Drawing Sheets

FIG. 3

APPARATUS AND METHOD FOR REMOVING OFFSET IN A GAIN CIRCUIT

BACKGROUND OF THE INVENTION

1. Field of the Invention

This invention relates in general to an offset-removing gain circuit and method, and more particularly to a device and method which allow an offset to be independent of the forward path, and furthermore allows a high pass filter time constant to be independent of the forward path gain.

2. Description of Related Art

In general, every radio receiver is used for receiving an input signal in one form and for outputting the signal in another form. As a part in doing this, many radio receivers convert a received input signal to a baseband signal. The baseband signal is the original configuration of the signal, that is, without the intermediate modulation that may have been performed in order to facilitate transmission of the signal.

One example of a radio receiver is the kind used in a wireless voice communication system. Generally, this radio receiver may be located in a cellular telephone, allowing the cellular phones in the network to communicate, and also allowing communication between a telephone in the network and a telephone in another communication network. Typically, such a radio receiver will divide the received input signal into Inphase and Quadrature signals, prior to carrying out the demodulation of each signal into the respective baseband signal. Thus, a radio receiver may simultaneously be processing an Inphase baseband signal and a Quadrature baseband signal.

Baseband signals are often offset by unwanted direct current (DC) signals as they propagate through the Inphase or Quadrature baseband channels. While passing through the baseband channels, the baseband signal goes through a series of stages, and it is often desirable or necessary to remove the DC offset signal from the baseband signal, as the DC offset will also be amplified.

The order of magnitude of the received input signals may for example be about $100\mu$ volts. Taking into consideration that the offset signal may be of the order of tens of millivolts, it is clear that such offsets can completely mask the desired signal if the offsets are allowed to accumulate.

There are systems and methods for removing the DC offset from the baseband signal. However, such systems and methods are associated with one or more disadvantages. One undesirable feature of prior art systems is that when the forward path gain in the circuit is altered during use, the offset-removing circuitry will experience a step response due to the gain change. The DC voltage output produced as a result of the step response may be misinterpreted as signal by subsequent components and circuitry.

Another disadvantage is that the high pass filter time constant associated with the offset-removing circuitry is often dependent on the forward path gain. As mentioned above, this leads to unwanted effects when altering the forward gain level during operation.

It can be seen, then, that there is a need for effective methods and techniques to remove DC offset in the baseband signal of a radio receiver, while allowing the detected offset to be independent of the forward path gain.

It can be seen that there is a need for a system for DC offset removal which is highly effective in removing DC offset while allowing the detected offset and the high pass filter time constant to be independent of the forward path gain.

SUMMARY OF THE INVENTION

To overcome the limitations in the prior art described above, and to overcome other limitations that will become apparent upon reading and understanding the present specification, the present invention discloses an offset removing gain circuit and method which are highly effective in eliminating DC offset at varying forward path gains.

The present invention solves the above-described problems by providing an offset removing gain circuit that allows the offset to be detected independently of the forward path gain.

A system in accordance with the principles of the present invention includes an offset removing gain circuit including a first circuit having a predetermined transfer function for reducing offset and producing a gain that varies during operation and a second circuit, coupled to the first circuit, for providing an integrator output, wherein the integrator output is used for reducing offset.

Other embodiments of a system in accordance with the principles of the invention may include alternative or optional additional aspects. One such aspect of the present invention is that the first circuit further comprises a first and second impedance device, coupled to a differential amplifier, for modifying the gain of the first circuit, wherein the first and second impedance device operate to produce a product of the first and second impedances that is selectable to provide different gains of the differential amplifier.

Another aspect of the present invention is that the second circuit further comprises a differential amplifier with an input, an output and a plurality of impedances, wherein the plurality of impedances include a third and a fourth impedance which are selected to remove offset at the integrator output without changing the frequency response.

Another aspect of the present invention is that at least one of the first and second impedances includes a resistor.

Another aspect of the present invention is that at least one of the first and second impedances includes a capacitor.

Another aspect of the present invention is that at least one of the first and second impedances includes a switched capacitor circuit, the switched capacitor circuit allowing selection of the gains of the differential amplifier.

Another aspect of the present invention is that the switched capacitor circuit includes first and second positive terminals, and first and second negative terminals, a first capacitor connected between the first positive terminal and the second positive terminal, a second capacitor connected between the first positive terminal and the second positive terminal, parallel to the first capacitor, a third capacitor connected between a first switch and the second positive terminal, a fourth capacitor connected between a second switch and the second positive terminal, a fifth capacitor connected between the first negative terminal and the second negative terminal, a sixth capacitor connected between the first negative terminal and the second negative terminal, parallel to the fifth capacitor, a seventh capacitor connected between a third switch and the second negative terminal and an eighth capacitor connected between a fourth switch and the second negative terminal, wherein the first switch connects the third capacitor to the first positive terminal, parallel to the second capacitor, or to the first negative terminal, the second switch connects the fourth capacitor to the first positive terminal, parallel to the second capacitor, or to ground, the third switch connects the seventh capacitor to the first negative terminal, parallel to the sixth capacitor, or to the first positive terminal and the fourth switch connects the eighth capacitor to the first negative terminal, parallel to the sixth capacitor, or to ground.

These and various other advantages and features of novelty which characterize the invention are pointed out with particularity in the claims annexed hereto and form a part hereof, However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout:

FIG. 3 shows a first embodiment of a gain circuit according to the invention;

DETAILED DESCRIPTION OF THE INVENTION

In the following description of the exemplary embodiment, reference is made to the accompanying drawings which form a part hereof, and in which is shown by way of illustration specific embodiments in which the invention may be practiced. It is to be understood that other embodiments may be utilized as structural changes may be made without departing from the scope of the present invention.

The present invention provides an offset removing gain circuit and method which are highly effective in removing DC offset from a signal. Particularly, the circuit and method are effective for removing DC offset while amplifying the signal, wherein the detected offset is independent of the forward path gain.

Figure 1:
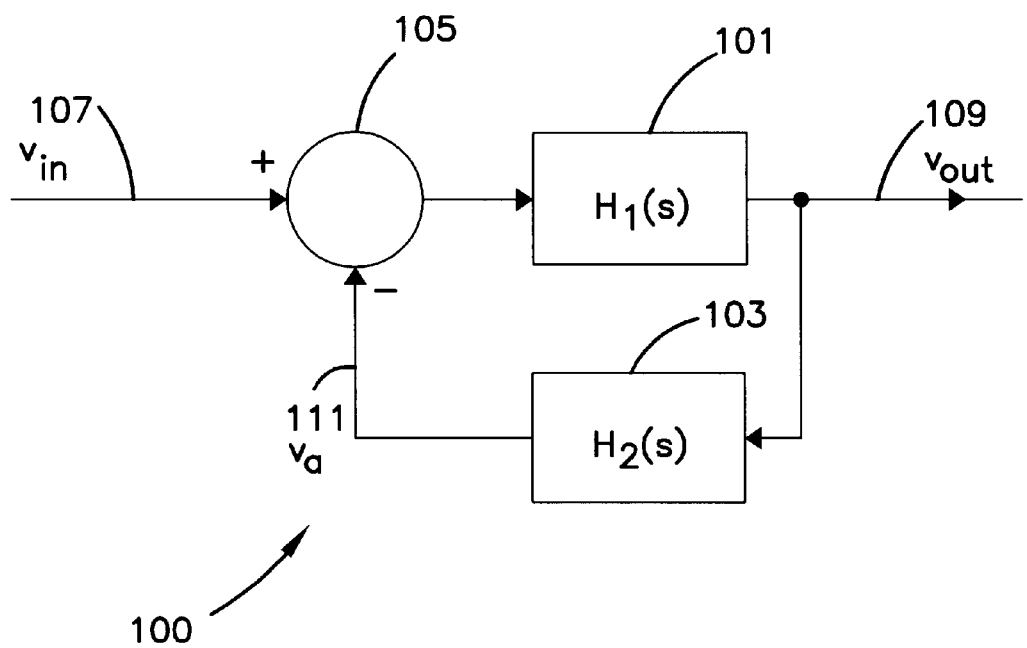
FIG. 1 shows an exemplary feed back circuit.

FIG. 1 schematically shows an exemplary feedback circuit 100. The circuit 100 includes devices 101 and 103. The devices 101 and 103 are typical components in a feedback system, such as a gain stage, and resistive or capacitive circuitry, respectively. A signal fed into any of the devices 101 and 103 is modified in accordance with the respective transfer function $H_1$ and $H_2$. An input signal $V_{in}$ 107 is fed into an adder/subtracter 105. The adder/subtracter 105 receives the input signal 107 and the feedback signal 111, and subtracts the feedback signal $V_a$ 111 from the input signal 107. The resulting signal is fed into the device 101. An output signal $V_{out}$ 109 is produced by the device 101. With the denominations from FIG. 1, the output signal 109 satisfies:

$$V_{out}=H_1(V_{in}-V_a) \tag{1}$$

Similarly, the feedback signal $V_a$ 111 is defined as the resulting signal when the transfer function $H_2$ is applied to the output signal 109 output from device 101. This relationship is expressed as:

$$V_a=H_2V_{out} \tag{2}$$

Using equations (1) and (2), one obtains that the ratio between the output signal 109 and the input signal 107 can be expressed as:

$$V_{out}/V_{in}=H_1/(1+H_1H_2) \tag{3}$$

For a typical device 101, the transfer function at low frequencies is essentially independent of the frequency. That is, the output signal is substantially equal to the input signal multiplied by a constant factor, usually referred to as the gain k. For the feedback device 103, the transfer function is essentially proportional to the inverted frequency. Thus, equation (3) can be rewritten, at low frequencies, as the following:

$$V_{out}/V_{in}=K_1=S/(S+K_1K_2) \tag{4}$$

It can be seen that equation (4) has the value zero at the origin, that is, at frequency s=0. It can also be seen that equation (4) has a pole when the frequency has the value $s=-k_1k_2$, where $k_1$ and $k_2$ are the respective gain factors for the two devices 101 and 103. In order to increase the amount of gain received through the circuit 100, one typically increases the gain factor $k_1$. However, this will alter the pole frequency of the transfer function, which is undesirable.

Figure 2:
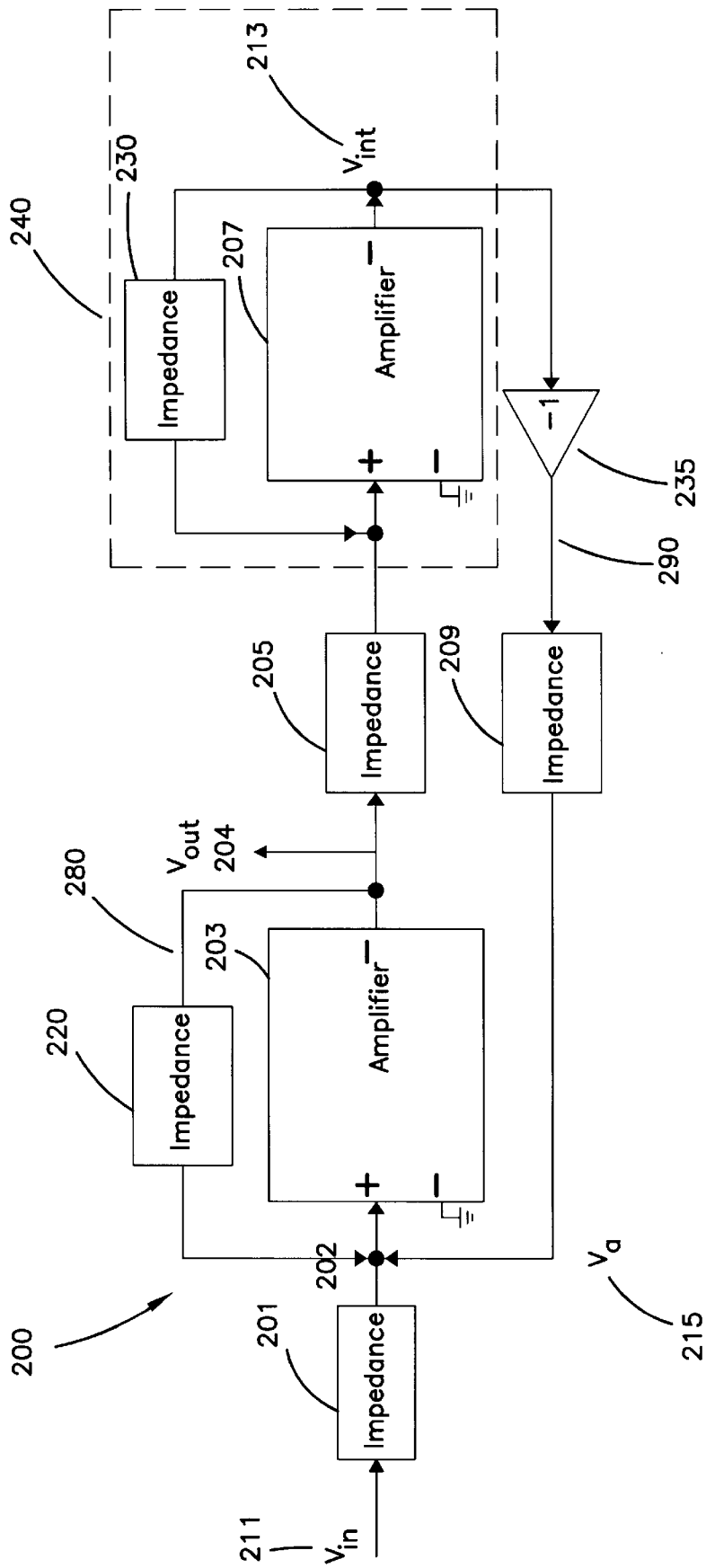
FIG. 2 schematically shows an embodiment of a gain circuit according to the invention.

FIG. 2 schematically shows an embodiment of a gain stage circuit 200. The gain stage circuit 200 includes a differential amplifier 203, with impedance 220 in a feedback loop 280, and an integrator 240. The integrator 240 includes a differential amplifier 207 and impedance 230. An input signal $V_{in}$ 211 is fed via an impedance 201 into the differential amplifier 203. At the junction 202 in a feedback signal $V_a$ 215 (which as explained below is an inverted version of $V_{int}$ 290) is combined with the input signal 211. The difference between the input signal 211 and the feedback signal 215 is fed into the differential amplifier 203, where the signal will undergo amplification. Any DC offset included in the signal will also be amplified by the differential amplifier 203. For this purpose, the feedback signal 215 is generated by feeding the output signal 204 through the impedance 205 into the integrator 240. The integrator signal $V_{int}$ 213 is fed through an inverter 235 to produce an inverted version of $V_{int}$ 290. The inverted version of $V_{int}$ 290 is then passed through the impedance 209 to the junction 202, where the inverted version of $V_{int}$ 290 is combined with the input signal 211. As an example, the ratio between the output voltage 204 and the input voltage 211 may satisfy equation (3).

Figure 3:
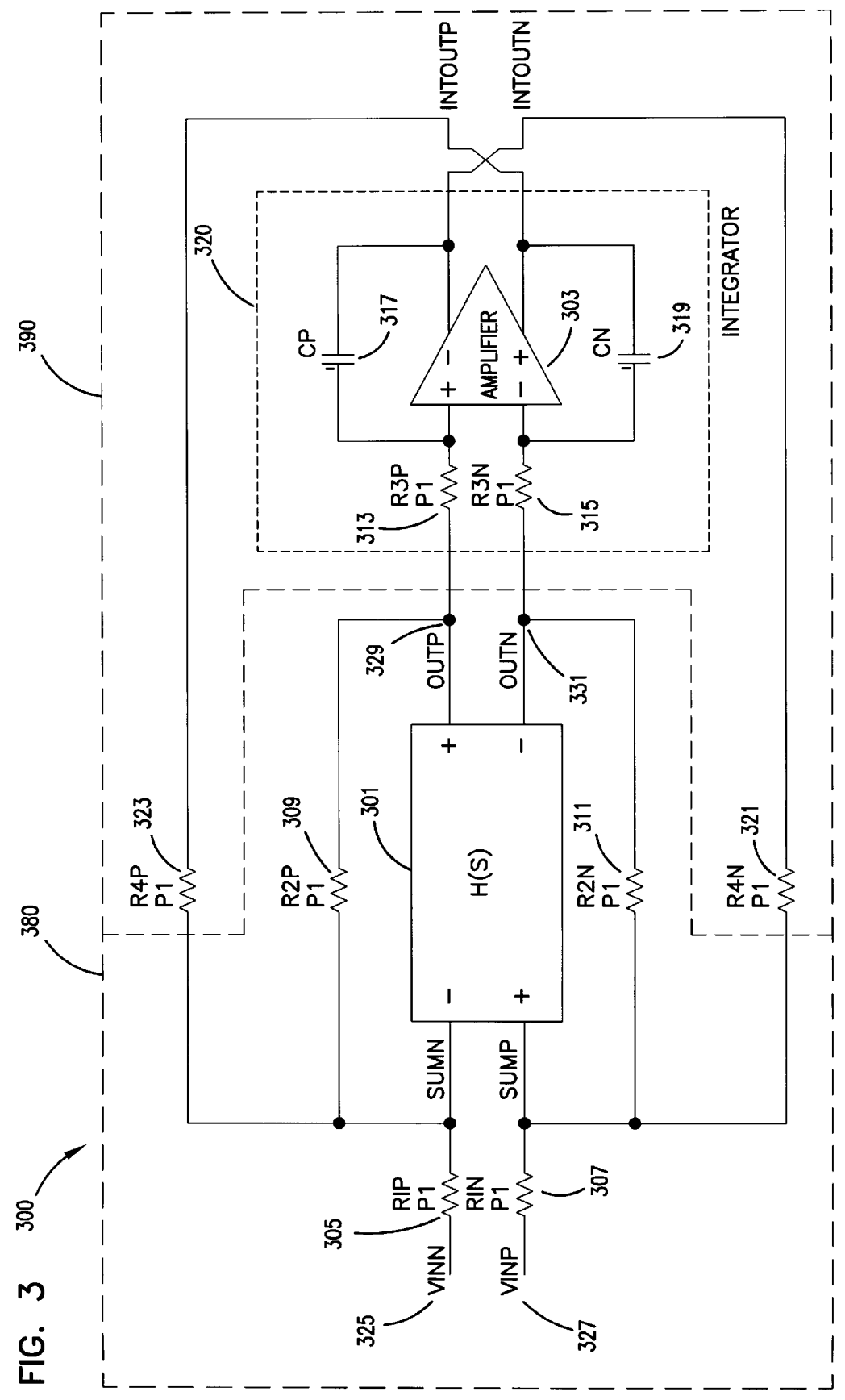

FIG. 3 schematically shows an embodiment of a gain stage circuit 300. The circuit 300 comprises differential amplifier transfer function 301 located in a first circuit 380. The differential amplifier transfer function 301 will be used to amplify and filter an input signal provided at the input terminals 325 and 327. The amplified signal will be output through the output terminals 329 and 331, after passing through the differential amplifying transfer function 301. Conventional differential amplifiers and feedback elements may be used within 301 with embodiments of the invention. The output signal from the differential amplifying transfer function 301 is fed back to the input of the differential amplifying transfer 301 function through resistances 309 and 311.

The circuit 300 may, for example, be used with balanced input signals. Input terminal 325 and input terminal 327 may therefore be labeled negative input terminal 325 and positive input terminal 327, respectively. The output terminal 329 and the output terminal 331 may be labeled the positive output terminal 329 and negative output terminal 331, respectively. The upper half of the circuit 300 may be labeled the positive path, and the lower half maybe labeled the negative path, respectively. In the second circuit 320, resistors 313, 315 amplifier 303 and capacitors 317, 319 constitute an integrator 320. The integrator 320 will be used to facilitate feedback of the output signal from the differential amplifying transfer function 301 in order to facilitate removal of DC offset which may occur in the signal. In the positive path of the circuit 300, the output from the amplifier 303 is fed back through capacitor 317 and again enters the amplifier 303. Similarly, in the negative path of the circuit 300, the output from the amplifier 303 is fed back through capacitor 319 and again reenters the amplifier 303.

The positive and negative output signals from the integrator 320 is fed through resistances 323 and 321, respectively, before it reenters the first of the differential amplifying transfer function 301. Conventional integrators 320 may be used with embodiments of the invention. Resistors 305 and 307 are provided to couple the input signal into the circuit at the input terminals 325 and 327, respectively.

When an input signal enters the circuit 300 through the input terminals 325 and 327, it passes through resistors 305 and 307 and then enters the differential amplifying transfer function 301. Also entering the differential amplifying transfer function 301 is the signal from the output terminals 329 and 331, fed back through the resistors 309 and 311, and furthermore the feedback signal from the integrator 320, fed back through the resistors 323 and 321. If the values of resistors 313, 315 and capacitors 317 and 319 are chosen properly and if the amplifiers 301, 303 have sufficient gain, the low frequency relation between the output signals at the terminals 329 and 331, on one hand, and the input signal at the input terminals 325 and 327, on the other hand, approximately satisfies the equation:

$$V_{out}/V_{in} = -(R2/R1)/(1+R2/(sC*R3*R4)) \quad (5)$$

Where $V_{out}$ is the output signal, $V_{in}$ is the input signal, R1 is the resistance of resistors 305 and 307, R2 is the resistance of resistors 309 and 311, R3 is the resistance of resistors 313 and 315, R4 is the resistance of resistors 323 and 321. C is the capacitance of capacitors 317 and 319, and s is the complex angular frequency. This transfer function (5) has a zero at the origin, that is, at s=0. The transfer function also has a pole, that is a singular value, at s=−R2/(R3*R4*C). These singularities imply a DC gain of zero and a passband gain of −R2/R1.

The output gain of the circuit 300 can be altered by changing the amount of resistance in the resistors 305 and 307. By changing the resistance in resistors 321 and 323, the amount of feedback from the integrator 320 can be altered. This may, for example, be used to increase the amount of feedback into the differential amplifying transfer function 301 when the resistance has been decreased in resistors 305 and 307. However, it can be seen from the relations above that altering the resistance R4 will affect the location of the pole in the transfer function (5). For example, since the term R4 occurs in the denominator of the pole frequency value, the pole frequency will increase with a decrease in the resistance in resistors 321 and 323. This is conveniently compensated by simultaneously altering the resistance R3, that is, the resistance in resistors 313 and 315. Because these terms are multiplied in the denominator of the pole frequency expression, the pole frequency will be unaltered as long as the product of the resistances remains constant. Exemplary values of the forward gain and the resistances of the resistors shown in FIG. 3 are schematically shown in Table 1.

TABLE 1

| forward gain | R1  | R2  | R3   | R4   |
|---|---|---|---|---|
| 1 | r   | r   | r'/k | r'   |
| k | r/k | r   | r'   | r'/k |

As can be seen in the first example of Table 1, by maintaining the resistances R1 and R2 at an exemplary value r, the forward gain attains a unitary value. In the same setting, the resistances R3 and R4 may have the values r'/k and r', respectively. In the second example shown in Table 1, the resistance R1 has been decreased to r/k. This yields a forward gain of k, since the ratio between R2 and R1 is r/(r/k)=k. In this second example in Table 1, the resistances R3 and R4 have been altered, so that R3 has been increased to r' and the resistance R4 has been decreased r'/k. Thus, it can be seen that the product of the resistances R3 and R4 is the same as in the first example in Table 1, whereby the pole frequency is not altered while the forward path gain is increased from a unitary value to the value k. This arrangement allows both the corrected offset and the high pass frequency response to be independent of the forward path gain k while allowing a constant DC voltage at the integrator outputs and "intoutp" and "intoutn" to be maintained when the gain switches.

Figure 4:
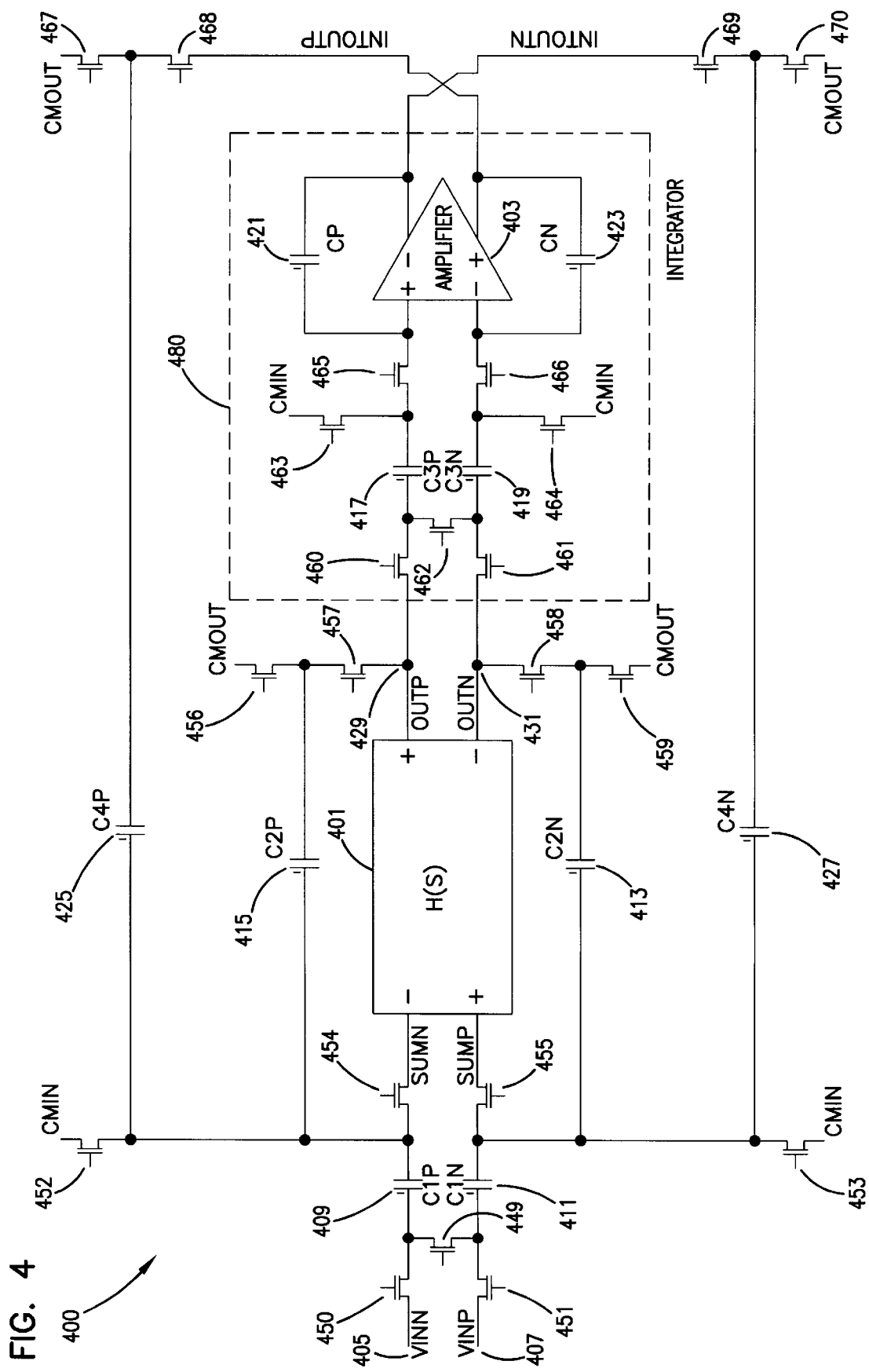
FIG. 4 shows a second embodiment of the gain circuit in accordance with the invention.

FIG. 4 shows an exemplary embodiment of an offset removing gain circuit 400. The circuit 400 may be used for amplification of an input signal while removing DC offset from the signal.

The circuit 400 comprises a differential amplifying transfer function 401. Conventional differential amplifiers and feedback elements may be used within 401 with embodiments of the invention. A signal output from the differential amplifying transfer function 401 is fed through the switched capacitors 417 and 419 into an amplifier 403. The amplifier 403 will be used to facilitate feedback of the output signal, in order to achieve removal of DC offset in the output signal. Amplifier 403 is included in an integrator 480 as shown in FIG. 4.

The circuit 400 includes capacitors at various positions in the signal path. Initially, the input signal enters through input terminals 405 and 407, and is fed through switched capacitors 409 and 411. The switched capacitors 409 and 411, as well as other capacitors which are to be described below (not all capacitors in this circuit are switched, CP 421 and CN 423 are part of the integrator 480 and are not switched). A plurality of switches (CMOS devices) are used to perform a desired operation of the circuit 400. The switches 449–470 are distributed along the positive and negative signal paths of the circuit 400 as is seen in FIG. 4. It is noted that the switch phases of the switches 449–470 are illustrated because numerous switch phases can be used to cause circuit 400 to act as a discrete time version of FIG. 3, circuit 300.

The input signal is fed through the differential amplifying transfer function 401, whereafter it is output at the terminals 429 and 431. The output signal is fed through switched capacitors 413 and 415, prior to being fed into the differential amplifying transfer function 401. The output signal at the terminals 429 and 431 is also fed through the switched capacitors 417 and 419, prior to entering the amplifier 403. The output from the amplifier 403 is fed through capacitors 421 and 423 and enters the amplifier 403.

The output signal from the integrator 403 is fed through switched capacitors 425 and 427 prior to entering the differential amplifying transfer function 401. This feedback signal facilitates removal of DC offset from the output signal detected at the terminals 429 and 431. Accordingly, the input signal from the input terminals 405 and 407, the signal fed back through the switched capacitors 413 and 415, and the feedback signal through the switched capacitors 425 and 427, are all fed into the differential amplifying transfer function 401.

In order to alter the forward path gain of a signal being fed through the circuit 400, the capacitance of the switched capacitors in the circuit may be altered. Under the assumption that the sampling frequency f of the circuit 400 is sufficiently higher than the desired high pass time constant formed by the integrator in the feedback path. The equivalent resistance of any switched capacitance in FIG. 4 is given by $1/(f \times C)$. Thus, if the values of the switched capacitors are properly chosen, the transfer function for the circuit 400, that is, the output signal at terminals 429 and 431, divided by the input signal at terminals 405 and 407, has a pole frequency at $s=f*C3*C4/(C2*C)$. In this expression, C3 is the capacitance of switched capacitors 417 and 419, C4 is the capacitance of switched capacitors 425 and 427, C2 is the capacitance of the switched capacitors 413 and 415, C1 is the capacitance of the capacitors 409 and 411, and C is the capacitance of the capacitors 421 and 423.

Some exemplary values of the capacitances together with the corresponding forward gain are shown in Table 2.

TABLE 2

| forward gain | C1 | C2 | C3 | C4 |
| --- | --- | --- | --- | --- |
| 1 | c | c | k*c' | c' |
| k | k*c | c | c' | k*c' |

As is seen from Table 2, when the capacitances C1 and C2 both have the exemplary value c, the circuit 400 has a unitary forward gain. In the same example, the capacitances C3 and C4 may have the values c' and k*c', respectively.

In the second example shown in Table 2, the capacitance C1 has been altered to the value k*c. This corresponds to the circuit 400 having a forward gain k. In the same example, the capacitances C3 and C4 have been altered to the values c' and k*c', respectively. Thus, it is seen from Table 2 that by altering the capacitances C3 and C4 in the described way, while increasing C1, the forward gain may be increased by a factor k while the pole of the transfer function remains unaffected. This arrangement allows both the corrected offset and the high pass frequency response of the circuit 400 to be independent of the forward path gain k.

Figure 5:
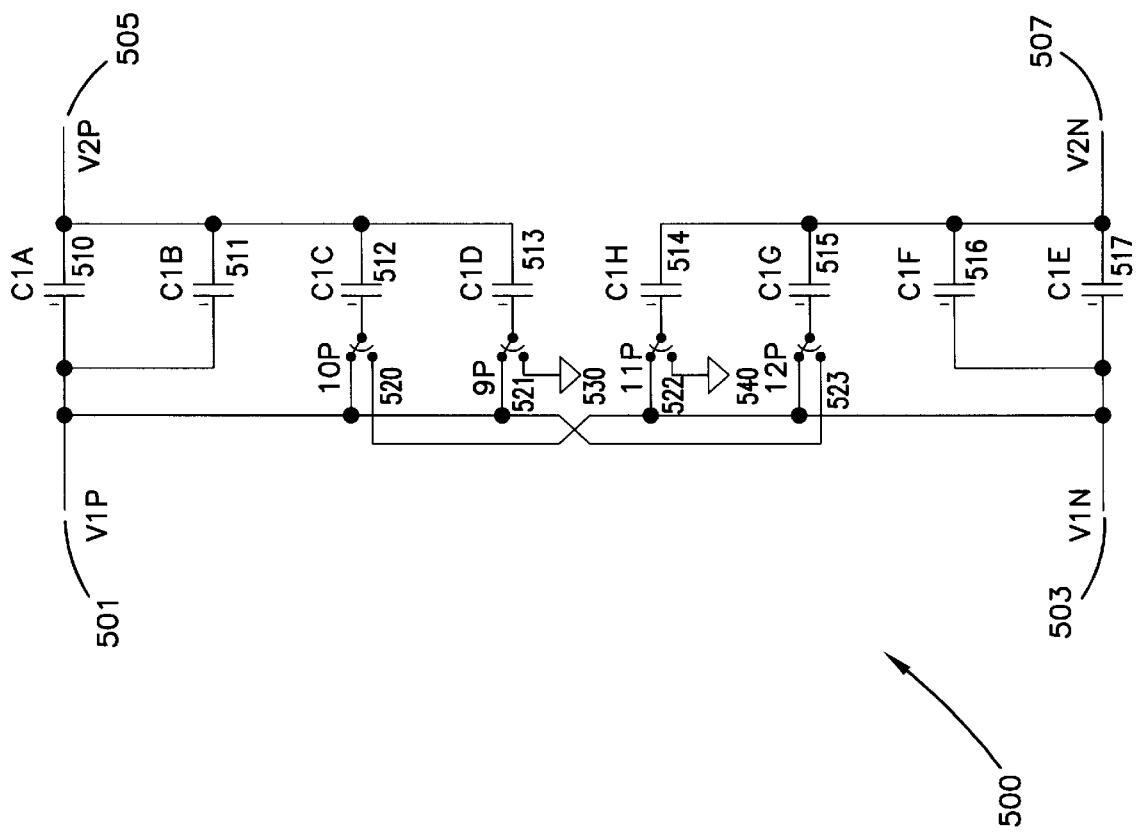
FIG. 5 shows an embodiment of a switched capacitor circuit in accordance with the invention.

The changing of the capacitance discussed above may be performed in different ways. An exemplary circuit 500 which allows switching between different capacitances is shown in FIG. 5. The circuit 500 includes input terminals 501 and 503, and corresponding output terminals 505 and 507. The circuit 500 is used for switching the value of the capacitance between terminals 501 and 505, on one hand, and terminals 503 and 507, on the other. The circuit 500 may, for example, be used to replace the capacitors 409 and 411 in circuit 400 in FIG. 4, whereby the input terminals 501 and 503 would be connected, respectively, to the input terminals 405 and 407; the output terminals 505 and 507 would be connected to the summing node of the differential amplifying transfer function 401. The circuit 500 comprises capacitors 510–517, which are connected to each other and to the input and output terminals 501–507 through a number of switches 520–523. Conventional capacitors and switches may be used.

In the shown embodiment, the capacitor 510 is connected between the input terminal 501 and the output terminal 505. The capacitor 511 is connected in parallel with the capacitor 510 between the input 501 and the output 505. The capacitor 512 is connected between the switch 520 and the output 505, and the capacitor 513 is connected between the switch 521 and the output 505. The switch 520 switches between connecting the capacitor 512 to the input 501, and connecting the capacitor 512 to the input terminal 503. The switch 521 switches between connecting capacitors 513 to the input 501, and connecting the capacitor 513 to ground 530.

The capacitor 517 is connected between the input 503 and the output 507. The capacitor 516 is connected parallel to the capacitor 517, between the input 503 and the output 507. The capacitor 515 is connected between the switch 523 and the output 507, and the capacitor 514 is connected between the switch 522 and the output 507. The switch 523 switches between connecting the capacitor 515 to the input 503, and connecting the capacitor 515 to the input 501. The switch 522 switches between connecting the capacitor 514 to the input 503, and connecting the capacitor 514 to the ground 540.

The switches 520–523 are typically NMOS devices. In an exemplary use of the circuit 500, the switches 520–523 are all set to an up position when it is desired to use the circuit 500 with a first capacitance. The switches 520–523 may be switched to a down position when it is desired to use the circuit with a second capacitance.

An exemplary use of the circuit 500 will now be described with reference to the circuit 400 in FIG. 4, and with reference to Table 2 above. With the configuration of the switches 520–523 as shown in FIG. 5, the capacitors 510–513, on one hand, and the capacitors 514–517 on the other hand, are connected in parallel and thus provide the highest capacitance available in circuit 500. This may, for example, provide the capacitors 409 and 411 with the capacitance k*c and the capacitors 425 and 427 with the capacitance k*c' as they have in the second example shown in Table 2 above. With the configuration of the switches opposite that shown in FIG. 5, the capacitors are connected to provide a fraction of the charge transfer of that shown in FIG. 5. In this case the effective capacitance from 501 to 505 and 503 to 507 is a fraction of that shown in FIG. 5. This may, in the above example, provide the capacitors 417 and 419 with capacitance c'. When it is desirable to decrease the forward gain of the circuit in FIG. 400, the switches in each of the three occurrences of circuit 500 in the above example would be toggled.

When increasing the forward gain by a factor k, the capacitance C3 should be decreased by a factor k, and the capacitance C4 and the capacitance C1 should be increased by a factor k. The increase and decrease in capacitance of a capacitor is easily provided with, for example, the switching capacitor circuit 500.

In the configuration shown in FIG. 5, the capacitance has its highest value, say 4c', wherein c' is the capacitance of a capacitor and where k=4. In order to decrease the capacitance by a factor 4, the switches 520–523 are switched to their lower positions. This results in the capacitor 512 being connected to the input 503, the capacitor 513 being connected to ground 530, the capacitor 514 being connected to ground 540, and the capacitor 515 being connected to the input 501.

As an example, the input terminal 501 and output terminal 505 may be "positive" terminals for a balanced signal in the circuit 500, and the input terminal 503 and the output terminal 507 are "negative" terminals for the balanced signal. Output terminals 505 and 507 are typically connected to the summing node of an amplifier.

In the exemplary configuration, the capacitors 510 and 511 will be charged to a positive input voltage, while capacitor 512 is charged with a negative input voltage. Capacitors 517 and 516 will be charged with a negative input voltage, while capacitor 515 is charged with a positive input voltage. Capacitors 513 and 514 are connected to grounds 530 and 540 when the switches 520–523 are in their lower position.

When charge is transferred from the capacitors 510–517 in this configuration, the charge on capacitor 512 will cancel half the charge on the capacitors 510 and 511, causing the net charge transferred to be that of a single capacitor in the circuit 500. The charge on the capacitor 515 will cancel half the charge on the capacitors 516 and 517, causing the net charge transferred to be that of a single capacitor in the circuit 500. This may, for example, give the amplifier 403 in FIG. 4 identical charge transfer settling characteristics, independent of whether the forward gain of the circuit 400 is high or low. This facilitates the design of amplifier 403 and the amplifier at the input 401 with regard to the setting characteristics within the circuit 400.

Figure 6:
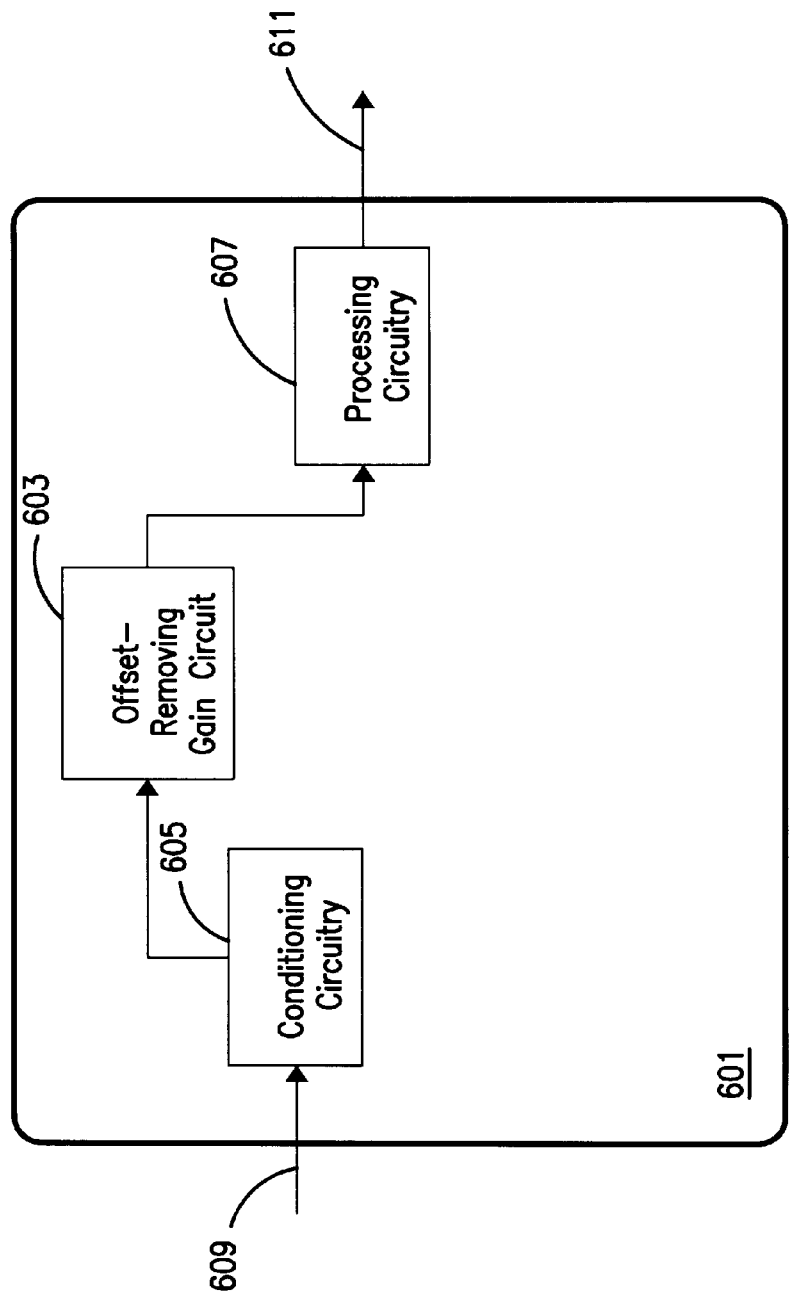
FIG. 6 schematically shows a CMOS receiver in accordance with the invention.

The offset removing gain circuits which have been described previously may be applicable to a number of different signal processing structures; for example, in a CMOS transceiver. It is preferable that the CMOS transceiver containing the offset removing gain circuit can be accommodated on a single semiconductor device, such as a chip. FIG. 6 schematically shows an exemplary embodiment of a device 601, which receives input signals at the input terminal 609 and produces output signals at the output terminal 611.

An offset removing gain circuit 603 is located on the device 601. Between the circuit 603 and the input terminal 609 is conditioning circuitry 605. Many different kinds of well known conditioning circuitry may be used with embodiments of the invention. For example, the conditioning circuitry 605 may include anti-aliasing filters, amplifiers, etc. Combinations of different circuitry may also be included in the conditioning circuitry 605.

After the signal has passed through the gain circuit 603, where DC offset is removed in accordance with the principles of the invention, the signal passes through processing circuitry 607 before being output at terminal 611. Many different types of processing circuitry may be used with embodiments of the invention. The processing circuitry 607 may, for example, include an analog/digital converter which converts the signal output from the gain circuit 603 into digital signals to be transmitted to further components through the output 611.

Figure 7:
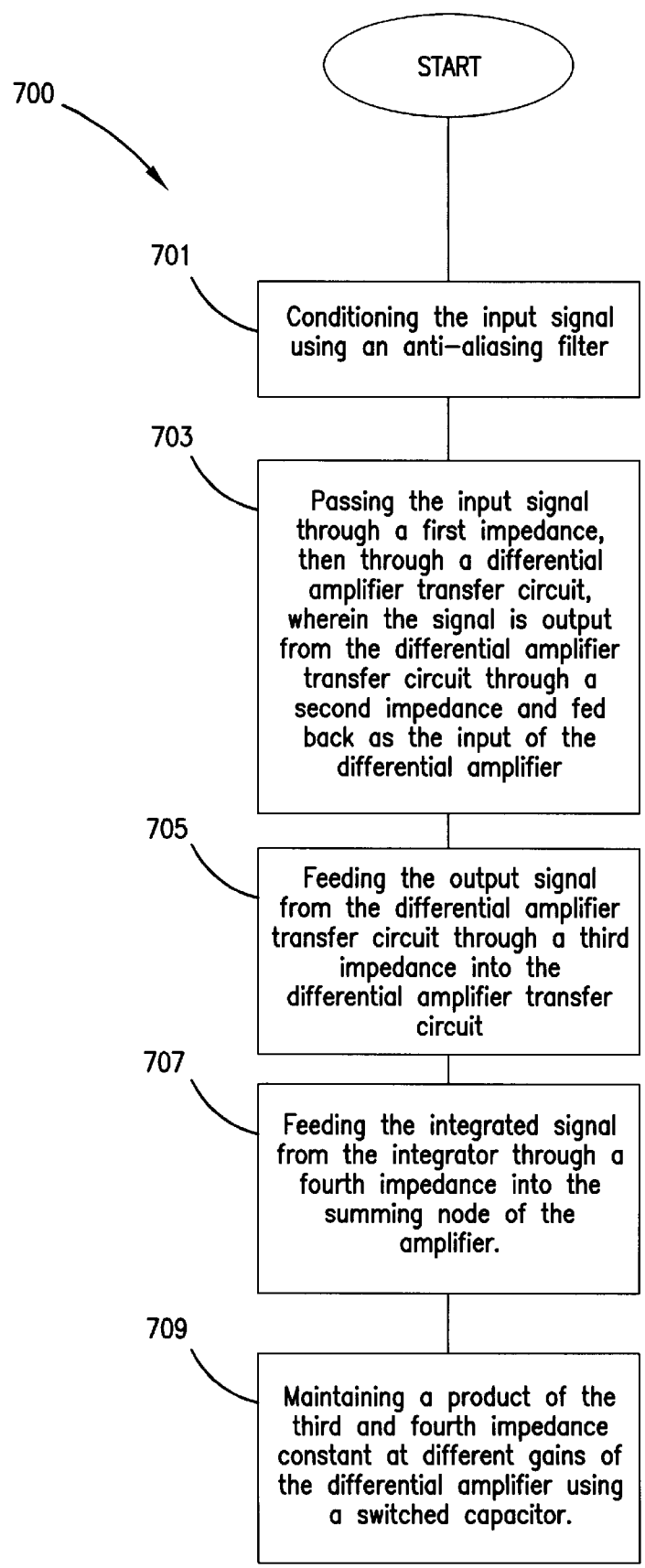
FIG. 7 is a flow chart of an embodiment of a method in accordance with the invention.

FIG. 7 is a flow chart schematically illustrating an embodiment of a method in accordance with the invention. In step 701, an input signal is conditioned using an anti-aliasing filter. The thus conditioned input signal is fed through a first impedance into a differential amplifier in step 703. The differential amplifier will serve to produce a desired gain in the input signal by means of feedback through a second impedance from the differential amplifier output back to its input. An output signal from the differential amplifier is fed through a third impedance into an integrator 705. The integrator is used to integrate the output signal in order to facilitate the removal of DC offset from the signal.

The integrated signal from the integrator output is fed back through a fourth impedance into the differential amplifier 707. This carries out the removal of DC offset by feeding the integrated signal back into the differential amplifier together with the input signal. When the above method is carried out at different values of the first impedance in order to modify the gain of the circuit, a product of the third and fourth impedances is held constant while maintaining the ratio of the first and fourth impedance 709. This may, for example, be done using a switched capacitor circuit. This method allows the offset detected by the integrator to be independent of the forward path gain. Furthermore, it allows the high pass filter time constant formed by the integrator and the circuit in the forward path, to be independent of the forward path gain. These features of the method allow the removal of DC offset to remain constant as the desired signal is detected and adjusted to the appropriate level at the output of the gain stages.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. An offset-removing gain circuit comprising:

a first circuit having a first transfer function to provide a gain of the circuit; and a second circuit having a second transfer function, coupled to the first circuit, to provide an integrator output to be fed back to the first circuit;

the first and second circuits being arranged and configured to be capable of producing a plurality of different gains while allowing a frequency response of the circuit to remain unaffected.

2. The circuit according to claim 1, wherein the first circuit further comprises a first and second impedance devices, coupled to a first differential amplifier, for modifying the gain of the first circuit, wherein the first and second impedance devices operate to produce a product of first and second impedances that are selectable to provide the different gains of the first differential amplifier.

3. The circuit according to claim 2, wherein the second circuit further comprises a second differential amplifier with an input, an output and a plurality of impedances, wherein the plurality of impedances include a third impedance and a fourth impedance which are selected to remove offset at the integrator output without changing the frequency response of the circuit.

4. The circuit according to claim 3, wherein at least one of the impedances includes a resistor.

5. The circuit according to claim 3, wherein at least one of the impedances includes a capacitor.

6. The circuit according to claim 3, wherein at least one of the impedances includes a switched capacitor circuit, the switched capacitor circuit allowing selection of the gains of the first differential amplifier and allowing the frequency response of the circuit to remain unaffected.

7. The circuit according to claim 6, wherein the switched capacitor circuit includes:

first and second positive terminals, and first and second negative terminals;

a first capacitor connected between the first positive terminal and the second positive terminal;

a second capacitor connected between the first positive terminal and the second positive terminal, parallel to the first capacitor;

a third capacitor connected between a first switch and the second positive terminal;

a fourth capacitor connected between a second switch and the second positive terminal;

a fifth capacitor connected between the first negative terminal and the second negative terminal;

a sixth capacitor connected between the first negative terminal and the second negative terminal, parallel to the fifth capacitor;

a seventh capacitor connected between a third switch and the second negative terminal; and an eighth capacitor connected between a fourth switch and the second negative terminal;

wherein the first switch connects the third capacitor to the first positive terminal, parallel to the second capacitor, or to the first negative terminal, the second switch connects the fourth capacitor to the first positive terminal, parallel to the second capacitor, or to ground, the third switch connects the seventh capacitor to the first negative terminal, parallel to the sixth capacitor, or to the first positive terminal and the fourth switch connects the eighth capacitor to the first negative terminal, parallel to the sixth capacitor, or to ground.

8. A CMOS transceiver on a single device, including:

conditioning circuitry conditioning a received signal;

an offset-removing gain circuit comprising:

a first circuit having a first transfer function to provide a gain of the circuit;

a second circuit having a second transfer function, coupled to the first circuit, to provide an integrator output to be fed back to the first circuit;

the first and second circuits being arranged and configured to be capable of producing a plurality of different gains while allowing a frequency response of the circuit to remain unaffected; and processing circuitry processing an output signal from the offset-removing gain circuit for receipt outside the device.

9. The CMOS transceiver according to claim 8, wherein the first circuit further comprises a first and second impedance devices, coupled to a first differential amplifier, for modifying the gain of the first circuit, wherein the first and second impedance devices operate to produce a product of first and second impedances that are selectable to provide different gains of the first differential amplifier.

10. The CMOS transceiver according to claim 9, wherein the second circuit further comprises a second differential amplifier with an input, an output and a plurality of impedances, wherein the plurality of impedances include a third impedance and a fourth impedance which are selected to remove offset at the integrator output without changing the frequency response of the circuit.

11. The CMOS transceiver according to claim 8, wherein the conditioning circuitry includes an anti-aliasing filter.

12. The CMOS transceiver according to claim 10, wherein at least one of the impedances includes a switched capacitor circuit, the switched capacitor circuit allowing selection of the gains of the differential amplifier and allowing the frequency response of the circuit to remain unaffected.

13. A method of removing offset from a signal while amplifying, the method comprising:

feeding an input signal into a differential amplifier via a first impedance device having a first impedance;

feeding an output of the differential amplifier through a feedback path including a second impedance device having a second impedance;

feeding the output signal from the differential amplifier though a third impedance device having a third impedance into an integrator;

feeding an inverted integrated signal from the integrator through a fourth impedance device having a fourth impedance into the differential amplifier; and changing the first impedance of the first impedance device to change a gain of the differential amplifier while selecting the third and fourth impedances of the third and fourth impedance devices to remove an offset at the integrator output and allow the frequency response of the circuit to remain unaffected.

14. The method according to claim 13, wherein a ratio of the first and fourth impedances of the first and fourth impedance devices remain constant.

15. The method according to claim 13, further comprising conditioning the input signal prior to feeding the input signal into the differential amplifier.

16. The method according to claim 15, wherein conditioning the input signal includes feeding the input signal through an anti-aliasing filter.

17. The circuit according to claim 3, wherein a product of the third impedance and the fourth impedance remains the same when the different gains are provided.

18. The CMOS transceiver according to claim 10, wherein a product of the third impedance and the fourth impedance remains the same when the different gains are provided.

19. The method according to claim 10, wherein a product of the third impedance and the fourth impedance remains the same when the gain is changed.

* * * * *